March 19, 1968 C. W. CONCELMAN 3,374,364
DIODE TRANSFER SWITCH
Filed Sept. 22, 1965
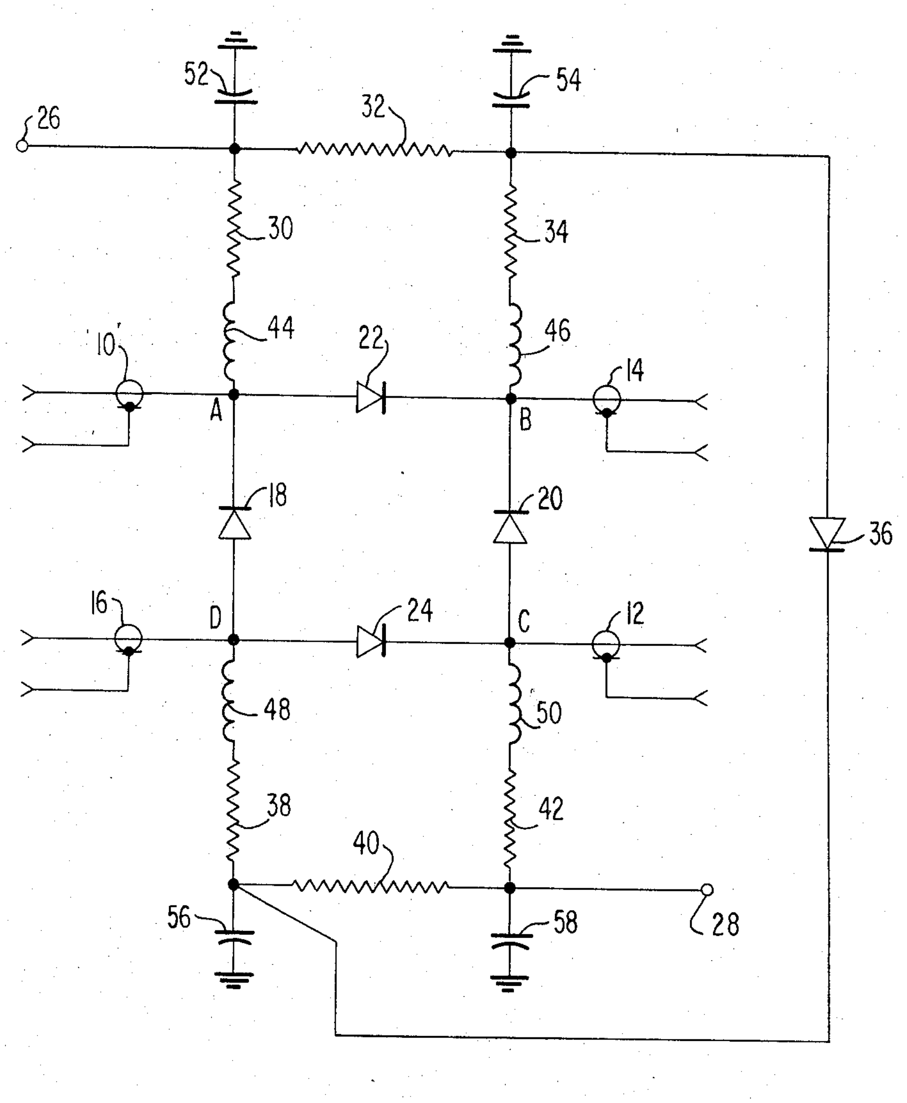
INVENTOR
CARL W. CONCELMAN
BY Burns, Doane, Benedict, Swecker & Mathis
ATTORNEYS United States Patent Office 3,374,364
Patented Mar. 19, 1968

3,374,364

DIODE TRANSFER SWITCH

Carl W. Concelman, Danbury, Conn., assignor to Amphenol Corporation, Broadview, Ill., a corporation of Delaware Filed Sept. 22, 1965, Ser. No. 489,345
8 Claims. (Cl. 307—257)

ABSTRACT OF THE DISCLOSURE

A high frequency, semi-conductor diode transfer switch utilizing a single voltage source for selectively switching two input radio frequency signal transmission lines between two output radio frequency signal transmission lines.

The present invention relates to a solid state transfer switch for high frequency circuits and more particularly to a radio frequency, solid state transfer switch operable by positive and negative voltages supplied to a single pair of bias terminals.

It is often desirable in high frequency circuit applications to selectively switch two input coaxial cables carrying radio frequency signals between two output coaxial cables. Switches, termed transfer switches, are utilized to connect each of two input coaxial cables to a different output coaxial cable in each of the two positions of the switch. Heretofore, many transfer switches have been of a mechanical design, thus having slow switching speeds as well as being physically bulky and heavy. Mechanical transfer switches generally include moving mechanical parts, and thus are subject to mechanical failures. Because of their moving parts, mechanical switches are also sometimes unable to meet the rigid shock and vibration resistance standards set for some electronic circuit assemblies. Additionally, mechanical transfer switches often have less than satisfactory electrical characteristics, such as crosstalk and insertion loss characteristics.

It has been known to use solid state elements which conduct in only one direction, such as semiconductor diodes, to electronically switch an input between several outputs. Solid state diode switches substantially eliminate many of the disadvantages of mechanical switches, as the diode switches have fast switching times, are lightweight, and meet rigid shock and vibration resistance requirements. As is well known, diodes become conductive when forwardly biased and non-conductive when reversely biased. Therefore, in many diode switches heretofore known, a plurality of voltage sources has been required to operate a single switch, thereby increasing the complexity and size of the switching arrangement. This requirement for a plurality of voltage sources has been particularly troublesome with respect to transfer switches having two input terminals and two output terminals, as two sources of voltage for forward biases and a third source for reverse bias have generally been considered necessary.

Accordingly, it is an object of the present invention to provide a solid state transfer switch which substantially eliminates the disadvantages of transfer switches heretofore available.

A more specific object of the invention is the provision of a radio frequency, solid state transfer switch which requires only one voltage source for selectively switching two input radio frequency signal transmission lines between two output radio frequency signal transmission lines.

A further object is the provision of a radio frequency transfer switch with a fast switching time and having excellent crosstalk and insertion loss characteristics.

The instant invention contemplates a solid state transfer switch for selectively switching two radio frequency signal inputs between two outputs and which comprises a plurality of semiconductor diodes arranged in a bridge configuration. Only one voltage source is required to alternately provide both forward and reverse biases to different pairs of the diodes in order to selectively present different paths for radio frequency signals between the inputs and the outputs.

The invention and its many advantages will be explained in greater detail with reference to the accompanying drawing which shows a circuit diagram of a preferred embodiment.

Referring now to the drawnig, a first radio frequency input terminal 10 and a second radio frequency input terminal 12 are provided to receive conventional coaxial lines carrying radio frequency signals. A first radio frequency output terminal 14 and a second radio frequency output terminal 16 are adapted to receive coaxial cable output lines. The input and the output terminals are connected at the junction points, A, B, C, and D of a diode bridge which comprises a first pair of semiconductor diodes 18 and 20 and a second pair of semiconductor diodes 22 and 24. At the junction points A and C, unlike terminals of adjacent diodes are coupled together. That is to say, the cathode of diode 18 is coupled to the anode of diode 22 at point A, and the cathode of diode 24 is coupled to the anode of diode 20 at point C. However, like terminals of adjacent diodes are coupled together at junction points B and D. Each of the diodes may provide a path for radio frequency signals when a proper biasing voltage, to be subsequently described, is applied.

The biasing voltage circuitry serves to forwardly bias on of the two pairs of bridge diodes and to simultaneously reversely bias the other pair of bridge diodes. The bridge brances containing the forwardly biased diodes provide flow paths for signal energy, while the remaining diodes are subjected to reverse biases sufficient to effectively block the transmission of signal energy along the bridge branches in which they are located. The magnitude of the reverse bias ordinarily is much greater than the magnitude of the forward bias.

The switch includes two bias voltage terminals 26 and 28, across which voltages of predetermined polarity may be applied to selectively bias the diode bridge. The biasing voltage supply, not shown, may be storage battery means or any other suitable conventional voltage supply means. Voltage dividing resistors 30, 32 and 34 are interconnected between bias voltage terminal 26 and the diode bridge, and a fifth diode 36 is connected between resistors 30, 32 and 34 and additional voltage dividing resistors 38, 40 and 42. The relative magnitudes of the resistors are chosen so as to provide either forward or reverse biasing voltages to the diode bridge, as will be later explained.

The terminal 26 is connected to bridge junction A through the resistance 30 and the terminal 28 is connected to bridge junction C through a resistance 42. Direct current flow paths through branches of the bridge are completed through the resistances 34 and 38 connected respectively to the bridge junctions B and D.

Interconnected between resistors 30 and 34 and the radio frequency terminals 10 and 14 are inductances, or chokes, 44 and 46, which prevent loss of radio frequency energy. Similar chokes 48 and 50 are disposed between the radio frequency terminals 12 and 16 and the biasing resistors 38 and 42. Each of these chokes present a very high impedance to high frequencies, and therefore the chokes prevent the radio frequency signals from entering the voltage supply system.

A first pair of capacitors 52 and 54 is connected between ground and the voltage dividing resistors directly connected to terminal 26. A second pair of like capacitors 56 and 58 are additionally connected to the voltage dividing resistors directly connected to the bias voltage terminal 28. These capacitors are, of course, provided to isolate the direct current bias voltages from chassis ground.

The operation of the circuit will be explained by first assuming that the positive terminal of a direct current voltage supply is connected to bias voltage terminal 26, with the negative terminal of the voltage source being connected to the bias voltage terminal 28. The voltage splits at the connection between the resistances 30 and 32 to provide two direct current flow paths: One path leads through resistance 32 and the other passes in series through resistance 30, inductance 44, diode 22, inductance 46, and resistance 34. In this condition of the circuit, the diode 36 is conductive so as to establish a flow path to the point of connection between resistances 38 and 40, where another split or division takes place. Current flows directly through the resistance 40 to the terminal 28 and also through the loop containing in series resistance 38, inductance 48, diode 24, inductance 50, and resistance 42.

In this condition of the circuit, the bridge branches containing the diodes 22 and 24 provide excellent paths for the transmission of radio frequency signals between input 10 and output 14 and between input 12 and output 16. However, the substantial resistance of the portion of the circuit between bridge junctions B and D, that is the portion containing the components 46, 34, 36, 38, and 48, assures the establishment of reverse voltage gradients between junctions A and D and between junctions B and C of sufficient magnitude to prevent the transmission of signals through the bridge branches containing the diodes 18 and 20.

The direct current bias voltage applied to terminals 26 and 28 must be of sufficient magnitude that the diodes 22 and 24 remain in their desired state of conduction although the high frequency alternating current signals are passing through the diodes. As the magnitude of power of most radio frequency circuits utilizing coaxial cables is usually relatively low, the required direct current bias voltage for the present switch is not generally of a high magnitude.

The operating position of the switch may now be selectively changed by reversing the polarity of the voltage source on the two bias voltage terminals 26 and 28. The positive voltage will be applied to bias voltage terminal 28 to establish parallel direct current flow paths through the diodes 18 and 20. One path includes in series the components 40, 38, 48, 18, 44, and 30. The other path includes in series the components 42, 50, 20, 46, 34, and 32.

In this second condition of the circuit, signal paths are provided through the bridge diodes 18 and 20. Simultaneously, the diode 24 will be reversely biased to present a high impedance between the radio frequency terminals 12 and 16, the diode 22 will also be reversely biased to present a high impedance between the radio frequency terminals 10 and 14. The diode 36 also will be reversely biased to block the loop in which it is located. Thus, paths for radio frequency energy are presented between input terminal 10 and output terminal 16, as well as between input terminal 12 and output terminal 14. Again, the magnitude of the biasing voltage is sufficient to maintain the diodes 18 and 20 in their selected state of conduction even with the passage of the radio frequency signals.

The switch therefore has two operating positions, depending on the polarity of voltage applied to the two bias voltage terminals. Upon the application of a positive voltage to bias voltage terminal 26, radio frequency input terminal 10 is connected to output terminal 14, and input terminal 12 is connected to output terminal 16. When the voltage across the bias voltage terminals is reversed, the radio frequency input terminal 10 will be switched to be connected to output terminal 16, and the radio frequency input terminal 12 will simultaneously be switched to output terminal 14.

The circuitry of the present invention may be packaged to form a small durable switch having four conventional coaxial cable connectors and two external bias voltage terminals. The following is a tabular listing of values for the components of an embodiment of the present invention which has been found to work well in practice:

| | | |
|---|---|---|
| Resistors **30**, **34**, **38**, **42** | ohms | 510 |
| Resistors **32**, **40** | do | 1000 |
| Chokes **44**, **46**, **48**, **50** | microhenries | 3.3 |
| Capacitors **52**, **54**, **56**, **58** | picofarads | 470 |
| Diodes **18**, **20**, **22**, **24**, **36** | | Type 1N270 |

One potential source supplying 30 volts at 30 milliamperes may be applied to the bias voltage terminals 26 and 28. Typical performance values for a switch constructed with components having the above-listed magnitudes are tabulated below:

| | Frequency (mc.) | | | | |
|---|---|---|---|---|---|
| | 100 | 500 | 750 | 1000 | 1500 |
| Crosstalk (−decibels) | 46 | 33 | 30 | 26 | 25 |
| Insertion Loss (−decibels) | 0.9 | 0.7 | 0.2 | 0.7 | 1.3 |

While a preferred embodiment of the invention has been described in detail by way of example, variations and modifications which do not depart from the essence of the invention will be obvious to those skilled in the art.

What is claimed is:

1. An electronic transfer switch for selectively switching two radio frequency signal inputs between two outputs comprising a plurality of diodes arranged in a bridge configuration and connecting said inputs and outputs, means connectable to a single bias voltage source and responding to an applied voltage of one polarity for forwardly biasing a first group of said diodes and reversely biasing a second group of said diodes, said means responding to an applied voltage of opposite polarity for forwardly biasing said second group of said diodes and reversely biasing said first group of said diodes, the forwardly biased diodes providing paths for radio frequency signal transmission and the reversely biased diodes blocking radio frequency signal transmission.

2. A solid state transfer switch for selectively switching two radio frequency signal inputs between two outputs comprising four semiconductor diodes arranged in a bridge and connecting said inputs and outputs, means including a single pair of bias voltage terminals and a fifth semiconductor diode for providing, upon the application of a voltage of one polarity, a forward bias to a first pair of said diodes, said forwardly biased pair of diodes conducting to provide paths for radio frequency signals between each of said inputs and a selected output, said means providing, upon the application of a voltage of opposite polarity, a forward bias to a different pair of said diodes to establish paths for radio frequency signals between each of the inputs and a different selected output, said means further including inductance means to isolate said high frequency signals from said voltage source.

3. A solid state transfer switch for selectively coupling two radio frequency signal inputs to two outputs comprising a bridge including four semiconductor diodes and junction points therebetween, first and second signal input terminals connected to opposite junction points of said bridge, first and second signal output terminals connected to intermediate junction points of said bridge, two bias voltage terminals adapted to be connected to a single voltage supply so that voltages of opposite polarities may be applied selectively between such terminals, and circuit means connected to said bias voltage terminals and said bridge, said circuit means being operable in response to the application of a voltage of one polarity between said bias voltage terminals to forwardly bias first and second ones of said diodes and reversely bias third and fourth ones of said diodes for providing a first radio frequency signal path between said first signal input terminal and said first signal output terminal and for providing a second radio frequency signal path between said second signal input terminal and said second signal output terminal and for blocking radio frequency signal transmission between said paths, said circuit means being operable in response to the application of a voltage of opposite polarity between said bias voltage terminals to forwardly bias said third and fourth diodes and reversely bias said first and second diodes for providing a third radio frequency signal path between said first signal input terminal and said second signal output terminal and for providing a fourth radio frequency signal path between said second signal input terminal and said first signal output terminal and for blocking radio frequency transmission between said third and fourth paths.

4. A solid state transfer switch comprising a bridge including four semiconductor diodes so connected at junction points that a first pair of oppositely disposed junction points respectively couple together like terminals of adjacent diodes and a second pair of oppositely disposed junction points respectively couple together unlike terminals of adjacent diodes, a pair of radio frequency signal inputs connected respectively to the junction points of one of said pairs of of junction points, a pair of radio frequency signal outputs connected respectively to the junction points of the other of said pairs of junction points, two bias voltage terminals adapted to be connected to a single voltage supply so that voltages of opposite polarities may be applied selectively between such terminals, means connecting said bias voltage terminals to said second pair of junction points, and means connected to said first pair of junction points to complete direct current flow paths through a pair of oppositely disposed ones of said diodes and to provide across the remaining ones of said diodes reverse voltage gradients of sufficient magnitude to assure blocking thereof againt the passage of radio frequency signals.

5. A transfer switch as claimed in claim 4 including inductance means connected to said bridge for confining the flow of radio frequency signal energy to said bridge and said signal inputs and outputs.

6. A solid state switch for radio frequency circuits comprising an input terminal means, first and second output terminal means, first and second bias voltage means, said first bias voltage means being connected to said input terminal means and said first output terminal means, said second bias voltage means being connected to said second output terminal means, a pair of impedance means having only one direction of conduction, one of said impedance means being connected between said input terminal means and said first output terminal means, the second of said impedance means being connected between said input terminal means and said second output terminal means, a second pair of impedance means having only one direction of conduction, one of said second pair of impedance means being connected between said second bias voltage means and said first output terminal means, the second of said second pair of impedance means being connected between said second output terminal means and said second bias voltage means, said second pair of impedance means being directly connected together at a terminal of said second bias voltage means, whereby a voltage of a first polarity applied to said first bias voltage means provides a path for radio frequency signals between said input terminal means and said first output terminal means, and a voltage of a second polarity applied to said first bias voltage means provides a path for radio frequency signals between said first and input terminal means and said second output terminal means.

7. A solid state transfer switch for radio frequency lines operable in response to positive and negative bias voltages applied to a pair of bias voltage terminals comprising first and second input terminal means, first and second output terminal means, a first pair of semiconductor diodes each having a cathode and an anode, one of said first pair of diodes having an anode connected to said first input terminal means and a cathode connected to said first output terminal means, the second of said first pair of diodes having a cathode connected to said first input terminal means and an anode connected to said second output terminal means, a second pair of semiconductor diodes each having a cathode and an anode, one of said second pair of diodes having an anode connected to said second output terminal means and a cathode connected to said second input terminal means, the second of said second pair of diodes being connected to said first output terminal means by a cathode and to said second input terminal means by an anode, each of said bias voltage terminals being connected to voltage dividing means to provide biasing voltages to said interconnected diodes, a fifth semiconductor diode connected between said voltage dividing means, and inductance means between said voltage dividing means and said diodes for preventing the loss of radio frequency signal energy.

8. A solid state transfer switch for radio frequency lines operable in response to positive and negative bias voltages applied to a pair of bias voltage terminals comprising first and second input terminal means, first and second output terminal means, a first pair of semiconductor diodes each having a cathode and an anode, one of said first pair of diodes having an anode connected to said first input terminal means and a cathode connected to said first output terminal means, the second of said first pair of diodes having a cathode connected to said first input terminal means and an anode connected to said second output terminal means, a second pair of semiconductor diodes each having a cathode and an anode, one of said second pair of diodes having an anode connected to said second output terminal means and a cathode connected to said second input terminal means, the second of said second pair of diodes being connected to said first output terminal means by a cathode and to said second input terminal means by an anode, first and second pairs of resistance means, each of said first pair of resistance means being connected between one of said input terminal means and one of said bias terminals, each of said second pair of resistance means being connected to one of said output terminal means, a fifth semiconductor diode means having a cathode and an anode, said anode of said fifth diode being connected to the one of said resistance means connected to said first output terminal means, said cathode of said fifth diode being connected to the one of said second pair of resistance means connected to said second output terminal means, a third pair of resistance means each being connected between one of said first pair of resistance means and one of said second pair of resistance means whereby a positive voltage applied to one of said bias terminals provides a path for radio frequency signals between said first input terminal means and said first output terminal means and additionally provides a second radio frequency signal path between said second input terminal means and said second output terminal means, and a negative voltage applied to said one bias terminal provides a different pair of paths for high frequency signals between said input terminal means and said output terminal means.

References Cited

UNITED STATES PATENTS 3,146,357 8/1964 Spallone ---------- 307—88.5

ARTHUR GAUSS, *Primary Examiner.*

J. ZAZWORSKY, *Assistant Examiner.*